United States Patent
Brockmole et al.

(10) Patent No.: US 10,057,705 B2
(45) Date of Patent: Aug. 21, 2018

(54) SYSTEM AND METHOD FOR TRANSITIONING BETWEEN AUDIO SYSTEM MODES

(71) Applicant: Harman International Industries, Inc., Stamford, CT (US)

(72) Inventors: Jeffrey Michael Brockmole, Brighton, MI (US); Kevin Eric Heber, Carmel, IN (US); Kirk I. Bushen, Tewksbury, MA (US); Jeremy Adam Geisler, Farmington Hills, MI (US); Kenneth Deetz, Brighton, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 307 days.

(21) Appl. No.: 14/872,766

(22) Filed: Oct. 1, 2015

(65) Prior Publication Data
US 2016/0203811 A1   Jul. 14, 2016

Related U.S. Application Data

(60) Provisional application No. 62/102,698, filed on Jan. 13, 2015.

(51) Int. Cl.
| | |
|---|---|
| G10K 11/16 | (2006.01) |
| H04S 7/00 | (2006.01) |
| G10H 1/18 | (2006.01) |
| G06F 3/16 | (2006.01) |
| H03G 5/02 | (2006.01) |
| G06F 3/0484 | (2013.01) |

(52) U.S. Cl.
CPC ............. H04S 7/30 (2013.01); G10H 1/18 (2013.01); *G06F 3/04847* (2013.01); *G06F 3/165* (2013.01); *H03G 5/025* (2013.01); *H04S 7/302* (2013.01); *H04S 2400/09* (2013.01); *H04S 2400/13* (2013.01)

(58) Field of Classification Search
CPC .... H04S 7/30; H04S 2400/09; H04S 2400/13; H04S 7/302; G10H 1/18; G06F 3/04847; G06F 3/165; H03G 5/025
USPC ........................................................ 381/94.5
See application file for complete search history.

(56) References Cited

U.S. PATENT DOCUMENTS

| | | | |
|---|---|---|---|
| 6,195,572 B1 * | 2/2001 | Patterson | H04M 1/6016 379/388.03 |
| 7,026,539 B2 | 4/2006 | Pennock et al. | |
| 7,697,943 B2 * | 4/2010 | Jung | H04M 1/72572 455/404.2 |
| 8,751,029 B2 | 6/2014 | Soulodre | |

(Continued)

*Primary Examiner* — Oyesola C Ojo
(74) *Attorney, Agent, or Firm* — Brooks Kushman, P.C.

(57) ABSTRACT

Audio processing method is described to continuously process an audio signal while changing between audio modes so that the listener does not experience a discontinuous sound during the transition. The first audio signal can be combined with the second audio signal to produce a smooth, continuous output signal that changes to only having the second audio signal over a time period. A global gain can be reduced during the transition from the first audio mode to a subsequent audio mode. Differences in the parameters from the first mode to the second mode can be determined and the parameters that differ are stepped from an initial value to a subsequent value over a transition time to produce a smooth audio signal.

19 Claims, 6 Drawing Sheets

(56) References Cited

U.S. PATENT DOCUMENTS

| | | | | |
|---|---|---|---|---|
| 9,179,236 B2* | 11/2015 | Robinson | ................ | H04S 3/008 |
| 2004/0123316 A1* | 6/2004 | Kendall | ............. | H04N 5/44513 |
| | | | | 725/37 |
| 2008/0188273 A1* | 8/2008 | You | ..................... | H04M 1/0245 |
| | | | | 455/575.3 |
| 2010/0040242 A1* | 2/2010 | Yamaguchi | .............. | H03G 3/32 |
| | | | | 381/86 |
| 2010/0162117 A1* | 6/2010 | Basso | ..................... | H04S 7/301 |
| | | | | 715/716 |
| 2010/0166191 A1* | 7/2010 | Herre | .................... | G10L 19/173 |
| | | | | 38/1 |
| 2011/0081024 A1* | 4/2011 | Soulodre | ............... | G01S 3/8006 |
| | | | | 381/17 |
| 2013/0290818 A1* | 10/2013 | Arrasvuori | ......... | H04N 21/4383 |
| | | | | 715/201 |
| 2014/0149126 A1 | 5/2014 | Soulodre | | |
| 2015/0169280 A1* | 6/2015 | Suzuki | .................. | H03G 5/025 |
| | | | | 715/716 |
| 2015/0205572 A1* | 7/2015 | Holmes | .................. | G06F 3/165 |
| | | | | 715/728 |
| 2016/0283187 A1* | 9/2016 | Yamamoto | .............. | G06F 3/165 |

\* cited by examiner

SYSTEM AND METHOD FOR TRANSITIONING BETWEEN AUDIO SYSTEM MODES

CROSS-REFERENCE TO RELATED APPLICATION

This application claims the benefit of U.S. Provisional Application Ser. No. 62/102,698, filed Jan. 13, 2015 the disclosure of which is incorporated in its entirety by reference herein.

TECHNICAL FIELD

Aspects of the present disclosure provide audio system mode transition systems and methods, e.g., which switch audio system modes in a vehicle, home or other suitable environment.

BACKGROUND

A growing number of vehicles are equipped with advanced audio systems that include multiple settings that change the audio output to the listener. These settings may alter the listener's perception of the audio. When the audio system changes from one setting to another setting, there is a discontinuity that occurs when the first setting ends its audio processing and the subsequent setting begins its audio processing. This discontinuity is heard by the listener.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
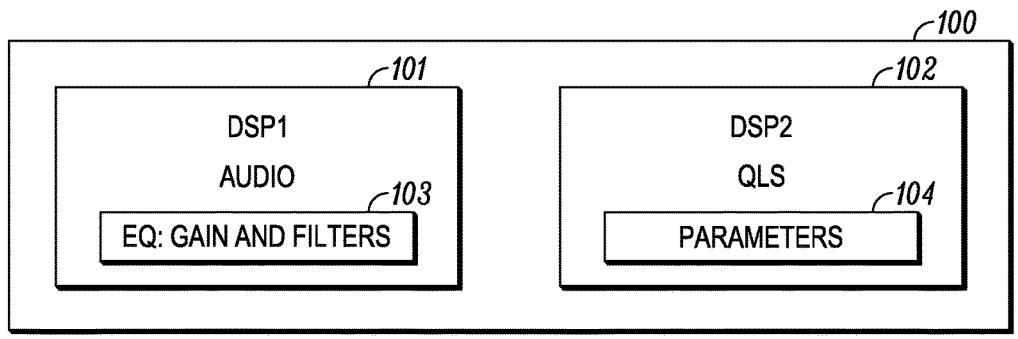
FIG. 1 shows a schematic view of an audio system according to an embodiment.

As required, detailed embodiments are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical/operational implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and instructions (e.g., software) which co-act with one another to perform operation(s) disclosed herein. In addition, any one or more of the electric devices may be configured to execute a computer-program that is embodied in a computer readable medium that is programmed to perform any number of the functions and features as disclosed. The computer readable medium may be non-transitory or in any form readable by a machine or electrical component.

Aspects disclosed herein may decrease the audio discontinuity between the different audio system modes. An audio discontinuity can be an audio artifact which produces a discontinuous aurally noticeably audio artifact in the sound produced by the audio system. When the audio processing switches from a first audio mode to a second audio mode, the presently described systems and methods smooth the transition between the two audio modes and may reduce the audible effect of the audio artifact. The presently described aspects smooth the transition as heard by a listener and may reduce an abrupt sound caused by the audio artifact in the transition intermediate the two modes or eliminate a relatively silent period. For example, when the processing occurs on different processing channels the current channel's gain is reduced while the subsequent channel's gain is increased until the current channel is off and the audio is only being processed through the subsequent channel. In another example, the audio processing settings from the current audio mode to the subsequent audio mode are adjusted from the current mode to the subsequent mode without a discontinuity or with an audio artifact that is reduced in severity. The gain and equalization can be raised or lowered from the current mode settings to the subsequent mode settings.

The audio system of the present disclosure implements a tuning tool that is specifically designed to tune the transition between each mode. In an example, the tuning tool may be part of the QUANTUMLOGIC™ Surround by Harman International of Stamford, Conn. (QLS) unit of the audio system. The methodology implemented in the audio system of the present disclosure allows for smooth transition, e.g., cross fading, between the different audio modes such that there is not a muted period between the different modes. The tuning tool defines the parameter sets that are the same or different between each mode. The tuning tool of the present disclosure further defines what happens in the transition—when parameters or settings change, how long the change lasts, which parameters are changing, how quickly they are changing. As the audio system of the present disclosure moves from one mode to another mode, the imaging drastically changes for the user while the user's perception of the tonal balance doesn't really change. Alternatively stated, the user's spatial perception of sound changes from one mode to the next. However, changing from one mode to another mode may produce and undesirable audio artifact.

FIG. 1 shows an audio system 100 that includes two digital signal processing ("DSP") units 101, 102. The DSP units 101, 102 provide on-board audio mixing functions so that various input and output signals may be mixed and then sent to specific outputs. The specific outputs can be additional signal processors, amplifiers or loudspeakers. The specific outputs can also perform monitoring. The DSP units 101, 102 also function to change the effects, physical modelling, and bass management for surround systems that utilize the audio system 100. DSP units 101, 102 can operate in any of plurality of audio modes. DSP units 101, 102 using the selected audio mode process the audio signal to output a desired audio sound profile. The first DSP unit 101 governs audio equalization (EQ) and can use gain(s) and filter(s) to provide equalization. Any number of gains or filters can be used for specific frequency bands to achieve the audio output desired. The second DSP unit 102 provides surround sound processing by using operational parameters on an audio input signal to achieve the audio output for a selected audio mode. The operational parameters can be set in the selected audio mode. The operational parameters can be different in the different audio modes. In an example, the surround sound is QuantumLogic Surround (QLS) by Harman International of Stamford, Conn. In an example, the surround sound can produce three dimensional sound output profiles by identifying and redistributing audio streams into the DSP units 101, 102. The audio streams output by the DSP units 101, 102 can incorporate additional audio streams that are reproduced via overhead speakers to create an unmatched three-dimensional surround experience. Other examples of a surround sound processing that can be embodied in the DSP units 101, 102 are described in greater detail in U.S. Pat. No. 8,670,850 and the U.S. Patent Application Publication Nos. 2011/081032 and 2011/081024, all of which are incorporated by reference.

The DSP units 101, 102 apply algorithms that use a plurality of parameters to process sound signals, e.g., at least one of the gain and the parameter settings to extract audio streams (e.g., voice signal(s), instrument(s) and spatial information) from the music source. The DSP units, using hardware, software or both, identify and send those audio streams to the appropriate speaker locations depending on the listening environment for the on-stage mode 202. In an example, the DSP units 101, 102 use the original material and does not add special effects, such as reverberation, to create a surround experience, e.g., on-stage or in the audience. The DSP units 101, 102 can also produce a stereo output or a mono output. Embedded spectral and spatial qualities of the input audio signal source are maintained to remain true to the integrity of the original audio source. The DSP units 101, 102 can output multi-channel surround sound output is compatible with various audio system architectures to produce audio in the selected audio mode. When switching between the DP units 101, 102, an audio artifact may be introduced when switching between the DP units 101, 102.

Figure 2:
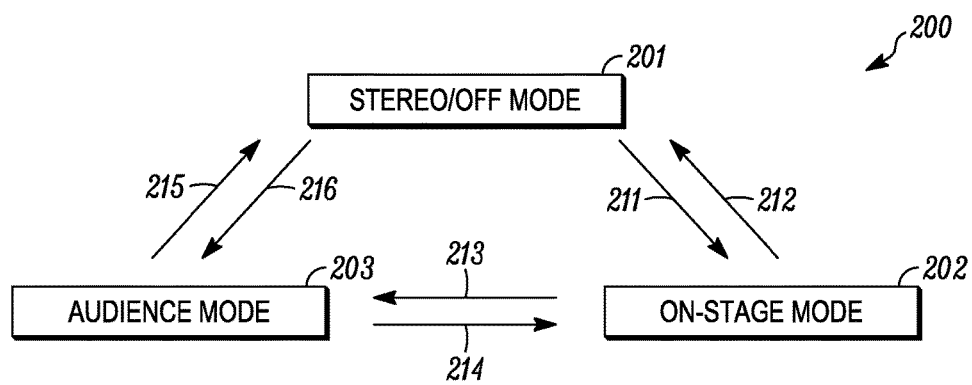
FIG. 2 shows a schematic view of modes of the audio system according to an embodiment.

FIG. 2 shows an audio system 200 that has multiple audio modes 201-203, here illustrated as three modes. The present disclosure is not limited to only three audio modes and may include two audio modes or greater than or equal to three modes. The audio system 200 may move between any of the different audio modes where the transition is continuous and no longer requires a short muted period between the different modes. That is, the transition between modes does not have a period of no audio or a significant step function in the output audio during the transition time between audio modes. Switching between the audio modes may introduce an audio artifact that is not part of the audio input signal being processed by the audio system 200. The transition time may also be free from an audio artifact created by the system 200 when the audio processing changes. Prior systems would halt a first mode and then start a subsequent mode resulting in a quiet period, a click noise or an audible discontinuity (e.g., an audio artifact) in the audio during the transition time or in the time between the first mode and the subsequent mode. The presently described systems and methods do not interrupt the audio and allow for continuous audio to be played by the system during the transition time. Examples of the audio modes will now be used to further explain the transition between audio modes. The first mode 201 is the "stereo/off" mode. The second mode 202 is the "on-stage" mode. The third mode 203 is the "audience" mode. A default mode can be the stereo mode. The off component of the stereo/off mode is the off status of the three dimensional audio processing in an example. There are specific functions that occur as the audio system goes between the three different modes. The timing between the three different modes can also be specified. The first mode 201 can produce a stereo audio signal. The gain and equalization parameters are set to, e.g., in the DSP units 101, 102, to produce a stereo output audio signal with a left signal and a right signal with no additional processing, e.g., spatial processing. The user may desire to change from the first mode 201 to the second mode 202, which is the on-stage mode. The second mode 202 remains true to the audio signal and includes gain and parameter settings to produce audio output that while remaining true to the original audio signal applies parameter values to make the listener believe that they are on-stage at the performance of the audio signal. When it is desired to move from the first audio mode 201 to the second audio mode 202, then a transition time period 211 is used to allow the change from the first mode 201 to the second mode 202. The transition time 211 may depend on the differences in the operation parameters from the first mode 201 to the second mode 202. The transition time 211 allows the audio system to produce an audio signal that transitions from the first mode 201 to the second mode 202 without an interruption in audio output as heard by the listener. That is, there is no dead air and no abrupt short duration noise (e.g., a click, pop, other sound or audio artifact that is discontinuous with the audio being output by the audio system 100, 200) in the output during the transition time 211. Likewise, transition time 212 provides a continuous sound during a transition, here from the second mode 202 (e.g., on-stage mode) to the first mode 201 (e.g., stereo/off mode). It will be understood that the transition times 211, 212 can be different lengths to allow the continuous audio being output during a transition time. The transition times 213, 214 are the time periods to transition between the second mode 202 and third mode 203 (e.g., the audience mode). The audience mode 203 includes parameters and a gain parameter, which process the audio signal so that the listener receives an impression that the listener is in an audience. The transition times 215, 216 are the time periods to transition between the first mode 201 and third mode 203.

It will be appreciated that each of the transitions between modes 201-203 can have a different transition times 211-216 to ensure that the audio signal is continuous when transitioning between the audio modes 201-203. The different transition times 211-216 can be based on the changes to the parameters for the audio modes 201-203. The transition time may be the time intermediate the current audio mode and the subsequent mode.

Figure 3:
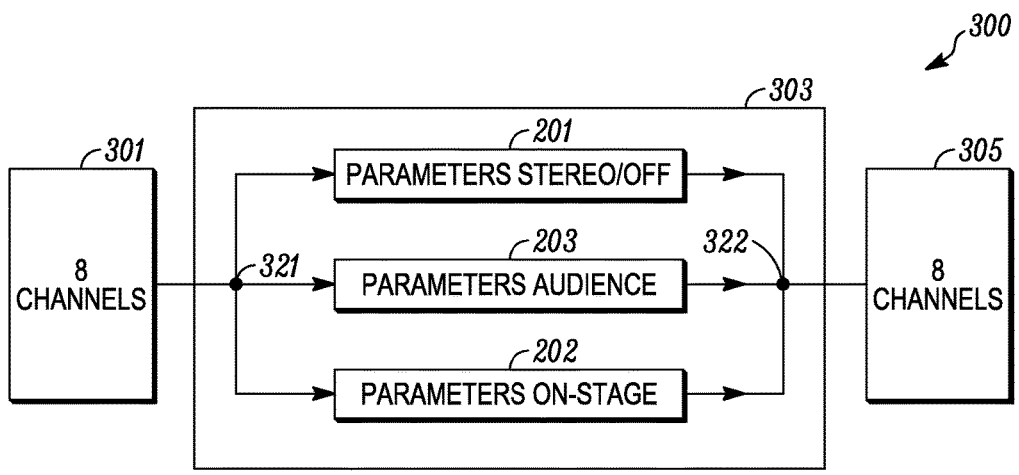
FIG. 3 shows a schematic view of audio signal processing for the audio system modes according to an embodiment.

FIG. 3 shows an audio system 300 which involves a multi-channel input 301 feeding multiple audio channels to a signal processing unit 303, which outputs a multi-channel output 305. Here, the input 301 is an eight channel input. The output 305 is an eight channel output. Other numbers of channels are within the scope of the present disclosure, e.g., five channels, six channels, seven channels or more. The signal processing unit 303 can include separate signal processors 201-203 for each of the audio modes for this audio processing system. Like FIG. 2, there are three signal processors 201-203 that can process the audio signal for a stereo/off mode, an audience mode, and an on-stage mode. In this example, each signal processor 201-203 employs a plurality of parameters for audio processing. Examples of parameters include equalization parameters (e.g., EQ) and a gain for each mode. Stereo/Off mode processor 201 has EQ parameters and a gain parameter. The audience mode processor 202 has EQ parameters and a gain parameter. The on-stage processor 203 has EQ parameters and a gain parameter. The multi-channel input signal can be routed from the input source 301 to any one of the three processors 201-203 for processing or to all three processors 201-203 for processing. In an example, node 321 is a switch that switches the input signal between the three processors 201-203. In an example, the node 322 is an output switch that can switch the output from any of the three processors 201-203 to the multichannel output 305. In another example, the input signal is supplied via node 321 to all three processors 201-203. In non-transition operation of the audio system only one of the processors 201-203 provides a processed audio signal to the output node 322 and, hence, to the audio output 305. When the audio system changes from one processor to another processor, then the system determines the difference in the processing parameters between the processors. The system can blend the present processor to the subsequent processor to continuously provide an audio signal at the output 305. This blended audio output is a short duration blend that morphs the audio output from the current processor to the subsequent processor, while reducing any audio artifact being produced during the change of processing parameters. In an example, the audio from the input 301 is being processed by the audience mode processor 202. The audio processing is changed to a subsequent process, e.g., the on-stage processor 203. The system can determine or have stored in a memory the equalization parameter differences between the processors. The system will step between the equalization parameter differences in increments that would not result in an audio interruption (e.g., an audio artifact) heard by a listener. In an example, the gain can be reduced before the processing is switched. Thereafter, the different equalization parameters are stepped to the new values. Thereafter the gain can return to the original setting or can be set at a new setting that is appropriate for the new audio processing. The gain reduction can be set to be less than the lowest value of either the current processing mode or the next processing mode. This reduced gain is set to last for at least the transition time from the current audio processing mode and the next audio processing mode. The reduced gain may reduce the effect of any audio artifact introduced by the system 300 when switching between modes.

It is understood that the equalization (EQ) for a particular mode (e.g., 201-203) can include filters, amplifiers, and delays. Equalization is the process which is commonly used to alter the frequency response of audio systems using filters, amplifiers, and delays. The filters can be linear filters. The EQ can also adjust the amplitude of audio signals at particular frequencies or frequency bands. Examples of equalizers in audio (e.g., music) production are parametric, semi-parametric, graphic, peak, and program equalizers. Parametric equalizers such as that used in the present disclosure may be used in order to remove (or to create) a resonance, for instance. These delays, filters, and gain are different for different frequencies or bands for the different processors 201-203 to process the input audio to the desired output audio.

As stated, just as there are specific equalization (EQ) parameters for each audio processing mode, and there is also a specific increase (or gain or amplification) in the voltage of the signal for each of the three modes. The entire purpose of an audio reproduction system is to take a very low voltage (e.g., a few millivolts) source signal and convert it to a mechanical signal that can be converted back to an electrical signal by your ears. Simply stated, an alternating current electrical audio signal is applied through a voice coil, which includes a coil of wire suspended in a circular gap between the poles of a permanent magnet. The voice coil is forced to move rapidly back and forth to cause a diaphragm attached to the coil to move back and forth, pushing on the air to create mechanical waves (e.g., sound waves). The speakers do the actual energy form conversion, but they require a much higher voltage to operate than is present directly from the source converter. It will also be understood that the audio reproduction system, e.g., system 100, 200 or 300, can also process at least some of the audio signal in a digital form. However, the processed signal at the loudspeaker is an analog signal that can be measured in volts to drive the loudspeaker to produce the desired sound wave (e.g., mechanical signal) to be heard by the listener, whose ears convert the mechanical signal to an electrical signal for interpretation by the listener's brain. Any audio artifact that is in the drive signal to the voice coil may be reproduced by the diaphragm, which may not be pleasing to a listener's ear. It is a goal of several embodiment as described herein to reduce or eliminate and audio artifacts in the signal driving the voice coil.

Figure 4:
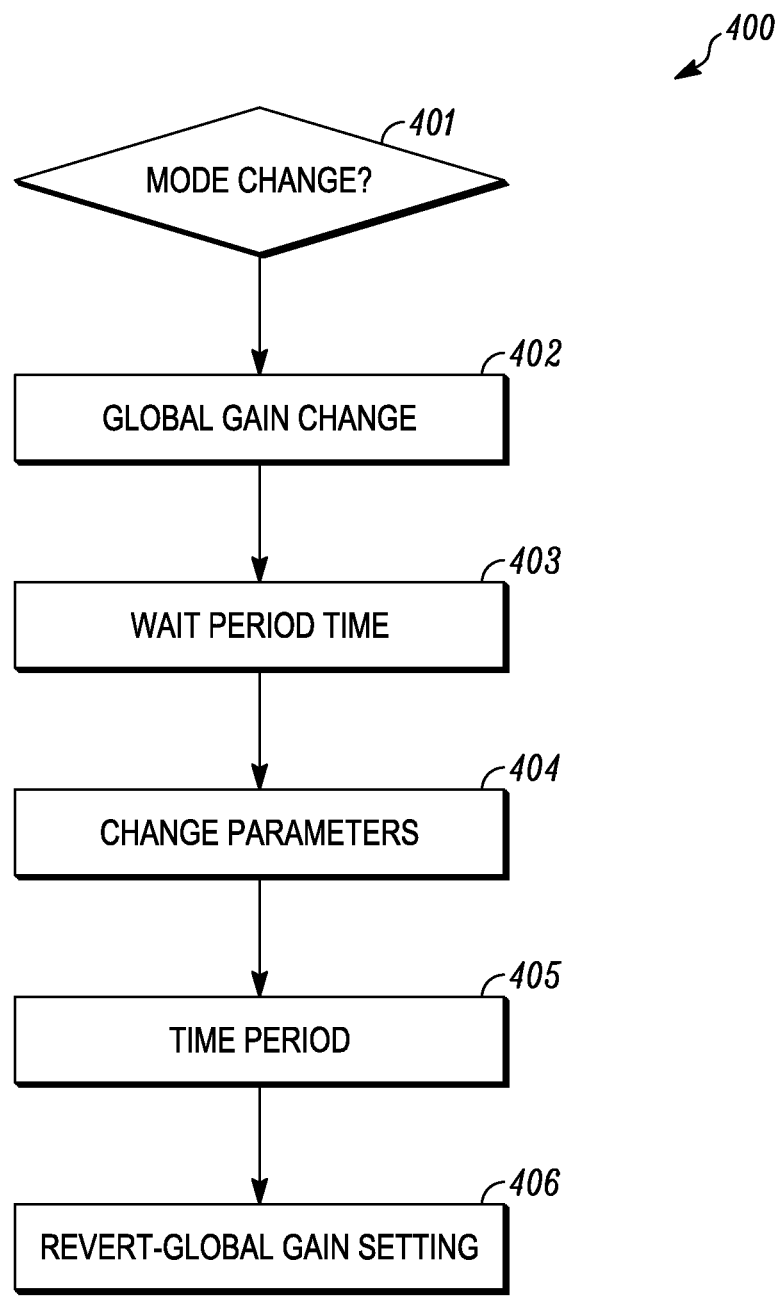
FIG. 4 shows a method for switching between audio modes according to an embodiment.

FIG. 4 shows a method 400 for operating an audio system to provide for a non-interrupted audio when transitioning between audio modes. With reference to the FIG. 4, in the first step of the present disclosure 401 the input signal is received for a mode change. An audio processing mode change may require a change in at least one operational parameter.

At 402, the second step in the present method (which can use any audio processing system described herein) involves a global gain change in the audio system. The global gain change is held for the transition time period, e.g., approximately one second, +/−tenth, tenths or hundredths of a second. Accordingly, when the audio system goes through a transition, the gain is modified to a level which is different from any of the three modes. This may reduce the effect of any audio artifact, At 403, a wait time period is set to allow the system time to change the parameters to the new audio processing.

At 404, the operational parameters are changed. Examples include changing any EQ setting and/or gain between the two different modes. For performing the change parameters step 404, after the equalization and gain changes occur, then the process may involve a change in the other parameters. Examples of other parameters include QLS parameters. It is understood that there may be numerous QLS parameters, e.g., over ten and as many as 72 (or more) different parameters that are changed. For example, when going between Stereo and either on-stage or audience modes, the algorithm may go from bypass (pass-thru) to ON. Therefore, under the aforementioned conditioned all other (QLS, over ten, up to 72) parameters may be technically changed. Alternatively, it is also understood that some of the other parameters may stay fixed while some other parameters change. Some examples of parameters that may change include, but are not limited to "reverb gain," "channel mixers" and/or "sound-stage width."

At 405, the operational parameters are set to the new audio processing mode and the transition time period ends. This system change occurs in approximately or less than one second and there is no muting of the system in the process. The time period allows the process or the system to be delayed another time period, e.g., one second, to allow for the smooth yet quick transition.

At 406, the transition to the new operational mode is complete and the audio system reverts back to the global gain setting. In the sixth step of the process, the overall audio system then changes the global gain such that the system reverts back to the overall desired gain.

During the transition process as described with reference to FIG. 4 or to the systems of FIGS. 1-3 and 5-6, a plurality of biquad filters (e.g., four) may be implemented to allow parameters of the audio signal to be tuned. The biquad filters can be second-order recursive linear, digital filters. The parameters may include center frequency, bandwidth, and the peak (or dip) gain. The bandwidth is defined at the arithmetic mean between the base of the filter and the peak power value. The biquad filters can be infinite impulse response filters and may allow the parameters to be cascaded together so that the overall effect of the biquad filters is given by the result of the frequency response of each filter taken together with the biquad filters. The magnitude response estimate of each of the three filters along with the overall magnitude response of the cascade of the filters can be the transition response to a new audio mode. In some applications, the filters can be finite impulse response filters.

It is understood that the aforementioned example method is simply one example method and system in which this issue of smoothly transitioning between the various modes is resolved so that there is no abrupt discontinuity in the audio signal output by the system that would interrupt the listener's enjoyment of the audio. That is, there is no pause in the audio during transition and there is not non-continuous audio (clicks, perceivable steps) being produced from the audio system.

Figure 5:
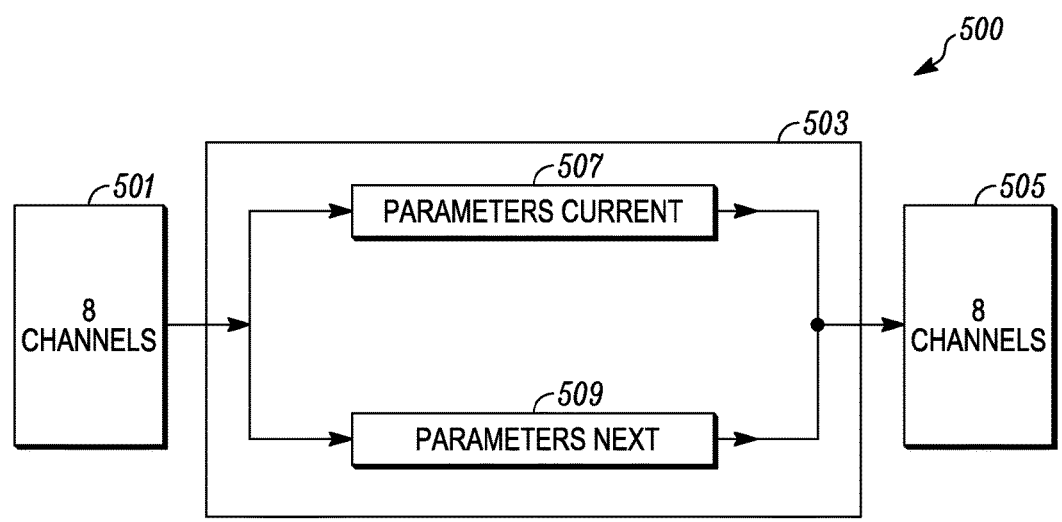
FIG. 5 shows a schematic view of audio signal processing for the audio system modes according to an embodiment.

FIG. 5 shows an audio system 500 having a multi-channel input 501 connected to a multi-channel output 505 through a signal processing unit 503. The signal processing unit 503 is reconfigurable such that there is simply a first audio processor 507 with a first set of operational parameters, e.g., first equalization and a first gain, which are dedicated to the current audio processing mode while a second audio processor 509 with a second set of operational parameters, e.g., second equalization and a second gain, which are dedicated to the next audio processing mode. The instructions in the audio system 500 would then implement the equalization and gain parameters for one of the specific modes (e.g., stereo/off, audience, or on-stage) as the current mode of the audio system. When there is a selection for changing from the current mode (e.g., first audio processor 507) to the next mode (e.g., second audio processor), the instructions of the audio system would then implement the operational parameters in the second processor 509 when the user indicates that he or she wants to switch to a different desired mode. In an example, the system loads the operational parameters associated with the next audio mode to the second processor 509. The system 500 then switches from the first processor 507 to the second processor 509 in a continuous manner. The change to the second processor 509 can be done according to any method described herein. In an example, the change reduces the global gain for a transition time period. Then the operational parameters that are different in the next audio mode that is loaded in the next audio processor 509 from the current audio mode in the current audio processor 507 are incrementally changed to the next audio mode's settings. This will not require that the audio sound be turned off or cause a "click" of other unwanted sound during the change to the next audio mode. The audio system 500 now uses the processor 509 as the current processor. When the audio mode is changed again, then the processor 507 is the processor for the next audio mode.

Figure 6:
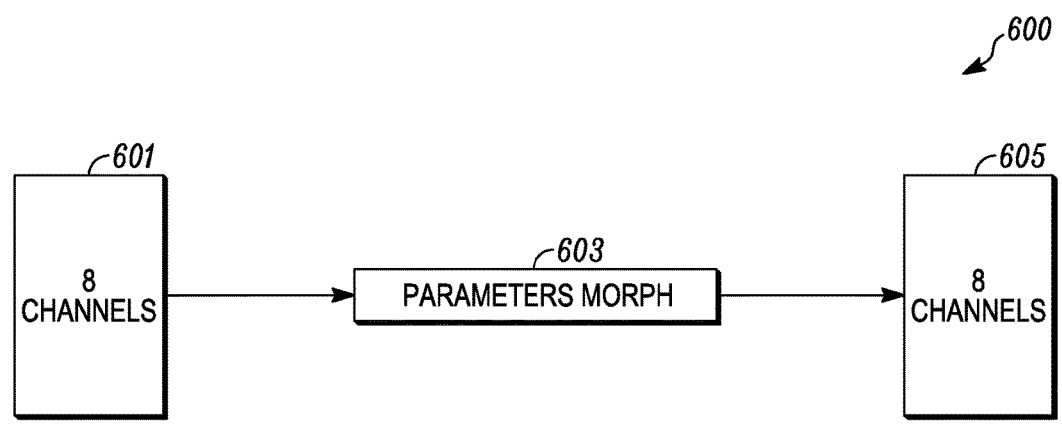
FIG. 6 shows a schematic view of audio signal processing for the audio system modes according to an embodiment.

FIG. 6 shows an audio system 600 where the equalizer and the gain in the present disclosure may simply change parameters as the user selects a change from one mode to another mode. Here, the audio operational parameters are loaded into a processor 603, which received a multi-channel audio input 601 and outputs a multi-channel audio output 605. The operational settings can morph the one system between the audio modes (e.g., stereo v. audience v. on-stage). In an example, the system 600 determines the differences in the operational parameters between the current audio mode and the next audio mode. An example of morphing is described in U.S. Pat. No. 7,026,539, which is incorporated by reference.

It is understood that in all of the presently described examples are non-limiting, the parameters for the global gain change may be varied and the time delay period may be varied. It is further understood that the biquad filters, the altered QLS parameters may be varied as well to obtain a different type of muteless transition from one mode of the audio system to another mode of the audio system while reducing the effect of any audio artifact when intermediate the modes during the transition time.

Figure 7:
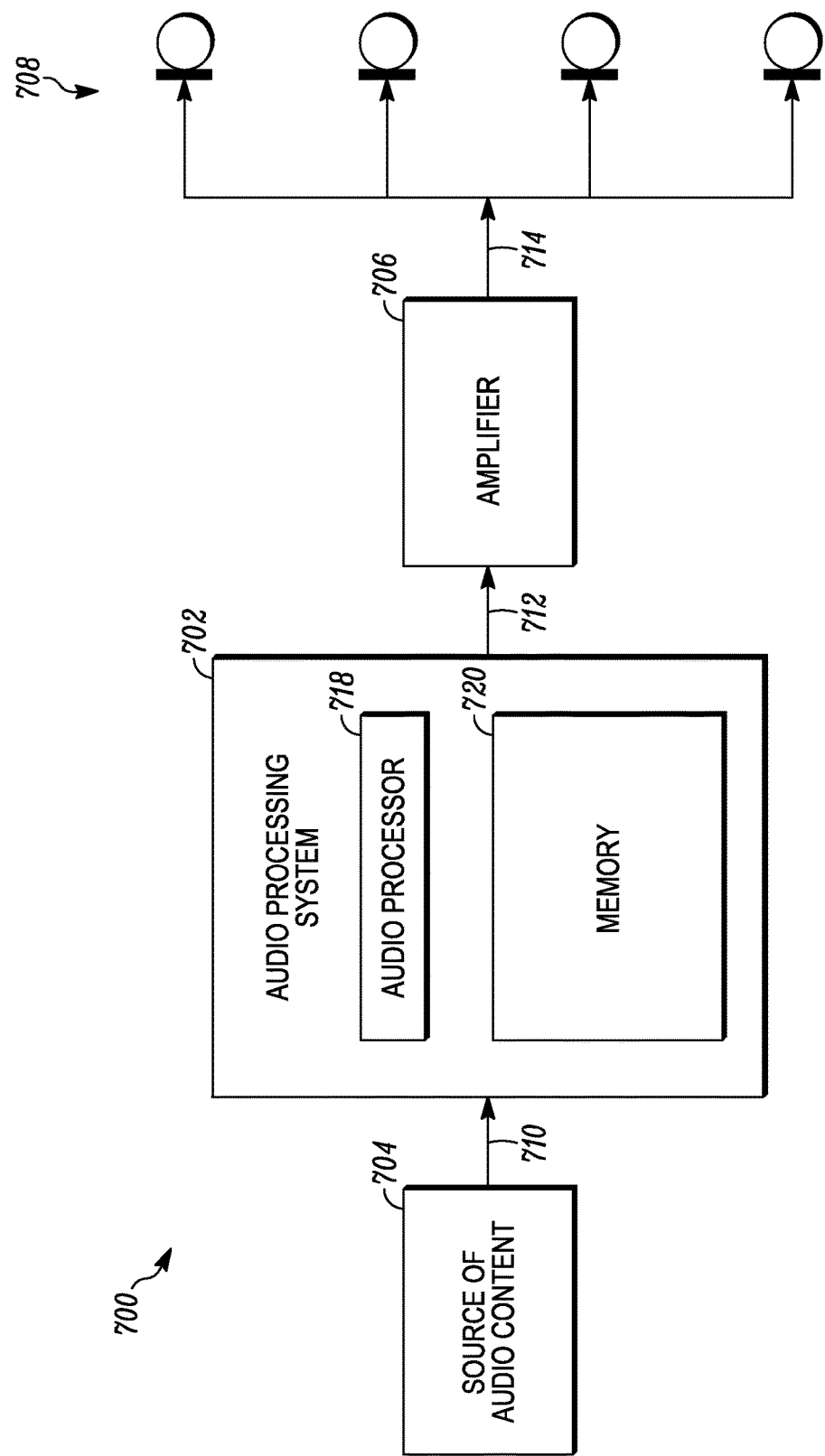
FIG. 7 shows a schematic view of an audio system according to an embodiment.

FIG. 7 is an example audio system 700 that includes an audio processing system 702. The audio system 700 may also include at least one source of audio content 704, at least one amplifier 706 and a plurality of loudspeakers 708. The audio system 700 may be any system capable of producing audible audio content. Example audio systems 700 include a vehicle audio system, a stationary consumer audio system such as a home theater system, an audio system for a multimedia system such as a movie theater or television, a multi-room audio system, a public address system such as in a stadium or convention center, an outdoor audio system, or any other venue in which it is desired to reproduce audible audio sound. Other example audio systems include portable audio systems such as digital music players, mobile phones, IPOD™ by Apple Corporation of Cupertino, Calif., boomboxes and the like.

The source of audio content 704 may be any form of one or more devices capable of generating and outputting different audio signals on at least two channels. Examples of the source of audio content 704 include a media player, such as a compact disc, or video disc player, a video system, a radio, a cassette tape player, a wireless or wireline communication device, a navigation system, a personal computer, a codec such as an MP3 player or an IPOD™ or any other form of audio related device capable of outputting different audio signals on at least two channels.

In FIG. 7, the source of audio content 704 produces two or more audio signals on respective audio input channels 710 from source material such as pre-recorded audible sound. The audio signals may be audio input signals produced by the source of audio content 704, and may be analog signals based on analog source material, or may be digital signals based on digital source material. Accordingly, the source of audio content 704 may include signal conversion capability such as analog-to-digital or digital-to-analog converters. In one example, the source of audio content 704 may produce stereo audio signals consisting of two substantially different audio signals representative of a right and a left channel provided on two audio input channels 710. In another example, the source of audio content 704 may produce greater than two audio signals on greater than two audio input channels 710, such as 5.1 surround, 6.1 surround, 7.1 surround or any other number of different audio signals produced on a respective same number of audio input channels 710.

The amplifier 706 may be any circuit or standalone device that receives audio input signals of relatively small magnitude, and outputs similar audio signals of relatively larger magnitude. Two or more audio input signals may be received on two or more amplifier input channels 712 and output on two or more audio output channels 714. In addition to amplification of the amplitude of the audio signals, the amplifier 706 may also include signal processing capability to shift phase, adjust frequency equalization, adjust delay or perform any other form of manipulation or adjustment of the audio signals. Also, the amplifier 706 may include capability to adjust volume, balance and/or fade of the audio signals provided on the audio output channels 714. The amplifier 706 may include settings that are adjusted from a current audio mode to a subsequent audio mode. In an alternative example, the amplifier may be omitted, such as when the loudspeakers 708 are in the form of a set of headphones, or when the audio output channels serve as the inputs to another audio device. In still other examples, the loudspeakers 708 may include the amplifier, such as when the loudspeakers 708 are self-powered loudspeakers.

The loudspeakers 708 may be positioned in a listening space such as a room, a vehicle, a venue, a stadium, outdoors or in any other space where the loudspeakers 708 can be operated. The loudspeakers 708 may be any size and may operate over any range of frequency. Each audio output channel 714 may supply a signal to drive one or more loudspeakers 708. Each of the loudspeakers 708 may include a single transducer, or multiple transducers. The loudspeakers 708 may also be operated in different frequency ranges such as a subwoofer, a woofer, a midrange and a tweeter. These different frequency ranges may be altered when seamlessly transitioning from the current audio mode to a subsequent audio mode. Two or more loudspeakers 708 may be included in the audio system 700.

The audio processing system 702 may receive the audio input signals from the source of audio content 704 on the audio input channels 710. Following processing, the audio processing system 702 provides processed audio signals on the amplifier input channels 712. The audio processing system 702 may be a separate unit or may be combined with the source of audio content 704, the amplifier 706 and/or the loudspeakers 708. Also, in other examples, the audio processing system 702 may communicate over a network or communication bus to interface with the source of audio content 704, the audio amplifier 706, the loudspeakers 708 and/or any other device or mechanism (including other audio processing systems 702). The audio processing system 702 may provide the audio modes. Thus, the system 702 may seamlessly adjust the audio output to the amplifier 706 or loudspeakers 708 when the audio mode is changed to reduce or eliminate any aurally produced audio artifact during switching the modes.

One or more audio processors 718 may be included in the audio processing system 702. The audio processors 718 may be one or more computing devices capable of processing audio and/or video signals, such as a computer processor, microprocessor, a digital signal processor, or any other device, series of devices or other mechanisms capable of performing logical operations. The audio processors 718 may operate in association with a memory 720 to execute instructions stored in the memory. The instructions may be in the form of software, firmware, computer code, or some combination thereof, and when executed by the audio processors 718 may provide the functionality of the audio processing system 702. The memory 720 may be any form of one or more data storage devices, such as volatile memory, non-volatile memory, electronic memory, magnetic memory, optical memory, or any other form of data storage device. In addition to instructions, operational parameters and data may also be stored in the memory 720. The memory 720 can store first settings (e.g., instructions, operational parameters and data) for a first audio mode, second settings (e.g., instructions, operational parameters and data) for a second audio mode, third settings (e.g., instructions, operational parameters and data) for a third audio mode, and so on to any number of audio modes. The audio settings stored in memory 720 can be settings for a stereo mode, a stereo off mode, an on-stage mode, an audience mode, a movie mode, a custom mode set by the listener, or other audio mode. The audio processing system 102 may also include electronic devices, electro-mechanical devices, or mechanical devices such as devices for conversion between analog and digital signals, filters, a user interface, a communications port, and/or any other functionality to operate and be accessible to a user and/or programmer within the audio system 700.

During operation in an example audio mode, the audio processing system 702 receives and processes the audio input signals. In general, during processing of the audio input signals, the audio processor 718 identifies a plurality of perceptual locations of each of a plurality of sources of audible sound represented within an audio input signal. The perceptual locations are representative of physical locations of the respective sources of audible sound within a listener perceived sound stage. Accordingly, if a listener were present at a live performance occurring on an actual stage, the perceptual locations would align with the locations on the stage of the performers, such as guitarists, drummers, singers and any other performers or objects producing sound within the audio signals.

The audio processor 718 decomposes the audio input signals into a set of spatial audio streams, or spatial slices, each containing audio content from a respective one (at least) of the perceptual locations. Any sound sources that are co-located within a given perceived location may be included in the same spatial audio stream. Any number of different spatial audio streams may be created across the listener perceived soundstage. The spatial audio streams may be independently processed with the audio processor 718.

The audio processor 718 may generate a plurality of filters for each of a plurality of respective output channels based on the identified perceptual locations of the respective sources of audible sound. The audio processor 718 may apply the filters to the audio input signal to generate the spatial audio streams. The audio processor may apply different filters in different audio modes. When the audio mode is changed, then the audio processor alters the response of the filters to move the audio output from the audio processor 718 from the initial audio mode to the subsequent audio mode without producing a discontinuity in the output audio. The spatial audio streams may be independently processed, e.g., on multiple processors, or a dedicated processor for each spatial audio stream. Following processing, the spatial audio streams may be assembled or otherwise recombined to generate an audio output signal having a plurality of respective audio output channels. The audio output channels are provided on the amplifier input lines 712. The audio processing system 702 may provide more or fewer audio output channels than the number of input channels included in the audio input signal. Alternatively, the audio processing system 702 may provide the same number of audio output channels as are provided as input channels.

Figure 8:
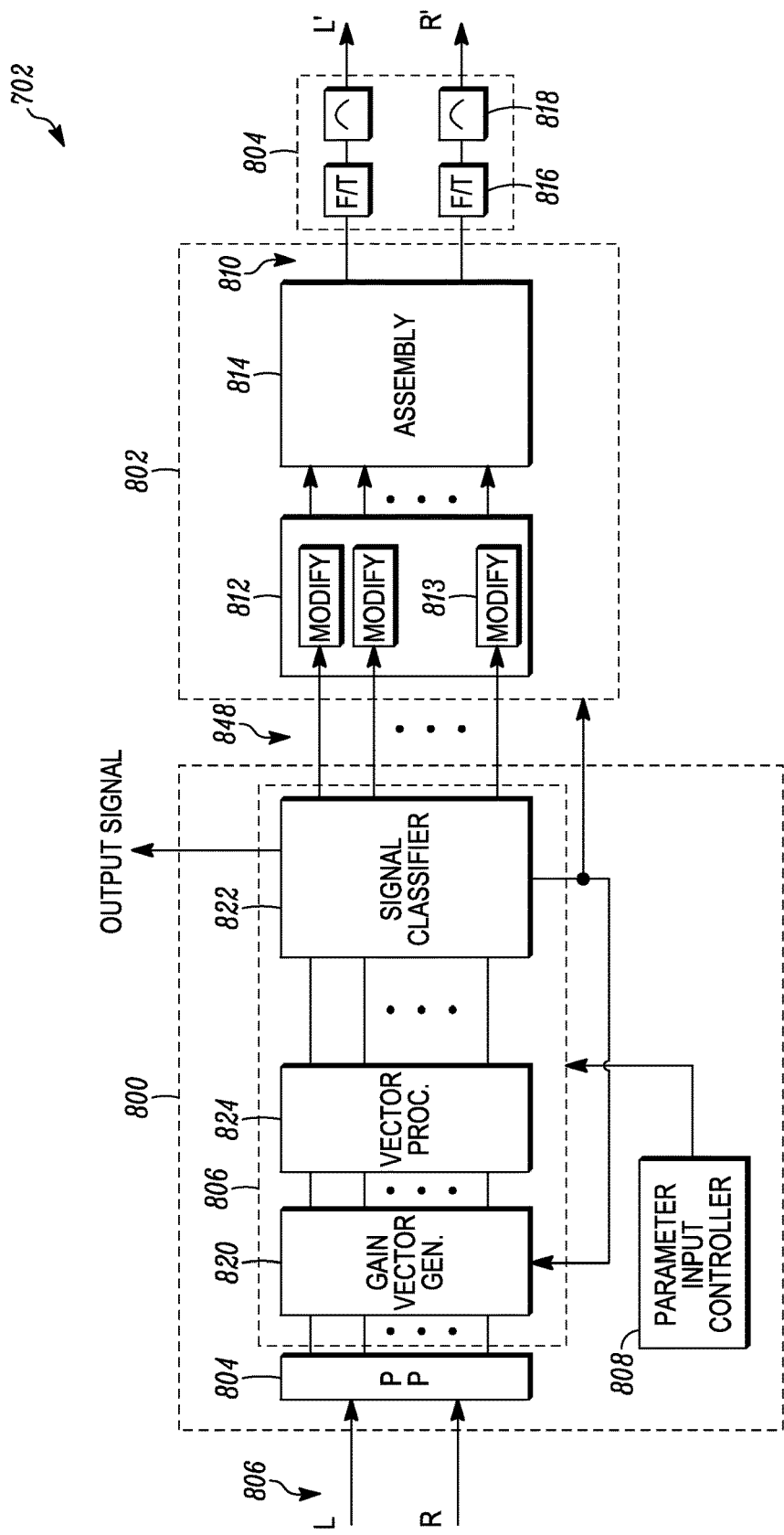
FIG. 8 shows a schematic view of an audio system according to an embodiment.

FIG. 8 is a block diagram of another example of the audio processing system 702 that may include the audio input signal dissection module 800, a sound source vector processing module 802, and a post-processing module 804. The audio input dissection module 800 may include a pre-processing module 804, the sound source vector generation module 806, and a parameter input controller 808. In addition, the sound source vector generation module 806 may include a gain vector generation module 820, the signal classifier module 822, and the vector processing module 824.

The pre-processing module 804 receives audio input signals 806 in the form of a left stereo signal (L) and right stereo signal (R). In other examples, any number of audio input signals could be provided. The audio input signals 806 may be converted to the frequency domain with the pre-processing module 804, or may be received directly by the sound source vector generation module 806 in the time domain.

The sound source vector generation module 806 may generate the sound source vectors (Ss) on the vector output lines 848 using the gain vector generation module 820, the signal classifier module 822, and the vector processing module 824. The sound source vectors (Ss) on the vector output lines 848 may be received by the sound source vector processing module 802. The sound source vector processing module 802 may also receive audio classification signals from the signal classifier module 822 indicating the identity of the audio sources in the respective spatial slices (sound source vectors (Ss)).

The sound source vector processing module 802 may generate audio output channels on the output channel lines 810 based on the processed sound source vectors (Ss). The sound source vector processing module 802 may include a sound source vector modification module 812 and an assembly module 814.

The sound source vector modification module 812 may include similar functionality to that previously described with respect to the vector processing module 824. The sound source vector modification module 812 includes a plurality of modify blocks 813 individually operable on each of the processed sound source vectors (Ss). Thus, the sound source vector modification module 812 may be used to add reverberation, perform equalization, add delay, add effects, perform dynamic range compression or expansion, enhance transients, extend the signal bandwidth, interpolate and/or extrapolate to reconstruct missing signal components, and/or perform any other audio processing related activities on a sound source vector-by-sound source vector basis. Processing within the sound source vector modification module 812 may be used to repair, restore, and enhance degraded audio signals. As such, individual spatial slices across the listener perceived sound stage may be independently modified, adjusted, and/or compensated without affecting any other audio sources in the other sound source vectors (Ss). For example, delay of particular spatial slices may be performed to emphasize the perception of certain spatial slices, or to alter the perceived width of the perceived soundstage. The sound source vector modification module 812 can operate in different audio modes and transition between audio modes.

The sound source vector modification module 812 may also perform modification of the individual sound source vectors (Ss) based on identification of audio sources in the individual vectors, e.g., as directed by any audio mode. The signal classifier module 822 may operate on each of the perceptual locations across the listener perceived sound stage to identify one or more audio sources included in a respective one of the perceptual locations. Following identification of the audio sources, the corresponding sound source vectors (Ss) may be modified based on the identified audio source. In contrast to the vector processing module 824 which uses the identification of the audio sources as a feedback for processing subsequent snapshots, the sound source vector modification module 812 is provided the identification of the audio sources as a feed forward. Thus, the sound source vector modification module 812 may process the individual sound source vectors (Ss) based on the identity of the respective audio sources as provided by the signal classifier module 822.

Modification based on identification of the audio sources may include repair of individual audio sources, adjustment of the width of the perceived soundstage and/or of individual audio sources included in the input signal, adjustment of the level of the reverberation, adjustment of the level of speech sources, reduction or removal of a vocal source, enhancement of percussive sources, dynamic range compression or expansion, bandwidth extension, extrapolation and/or interpolation to reconstruct missing components of individual audio sources, audio source specific effects or enhancements, and perceptual location adjustments across the listener perceived sound stage. Each of these modifications can be set differently in any of the audio modes. Accordingly, these can be seamlessly changed from one audio mode to the next audio mode. Repair of individual identified audio sources may include replacement of portions of the audio output of a specific audio source from a library or other audio source re-creation device, such as a MIDI player. For example, an audio source identified as a saxophone that includes notes having noisy sound output in certain frequencies may be replaced with the same notes in the same frequencies of saxophone audio outputs from a library or from a source capable of recreating the audio of a saxophone. The input audio signal may be damaged or degraded as a result of processing by a perceptual audio codec, such as an MP3 codec, or any other form of lossy compression. Other sources of degradation/damage include poor audio recording and/or storage practices, AM/FM and satellite radio broadcast, television broadcast, video codecs, wireless connections such as Bluetooth, voice codecs, as well as telephone networks, including cellular networks.

Audio source specific effects or enhancements may include changes to the sound source values included in a particular sound source vector (Ss) that are specific to the identified audio source. For example, an audio source identified as a voice may be increased in amplitude or adjusted in certain frequency bands to make the voice more easily discernable to a listener. Specific sound source vectors (Ss) may be compressed by application of a dynamic range compressor to increase intelligibility of an audio source appearing in more than one sound source vector (Ss). For example, where a speakers voice is present in not only a center sound source vector (Ss) but also adjacent left and right sound source vectors that also include respective musical instruments, or background noise, the center sound source vector may be dynamically compressed, or have its level altered. In another example, a musical instrument, such as a trumpet in a particular sound source vector (Ss) may be equalized to improve clarity. Each of these may be set in audio modes to achieve the desired effect of the audio mode.

Perceptual location adjustments may involve moving an identified audio source from one location to another different location in the listener perceived sound field. For example, a sound source such as singer's voice may be in the center channel with a second sound source, such as a guitar in a contiguously located sound source vector (Ss) in the listener perceived sound stage. Once identified with the signal classifier module 822, as a singer's voice and a guitar, the guitar sound source may be moved in the listener perceived sound stage to be spaced further away from the singer's voice by the sound source vector modification module 812. For example, the guitar may be moved over toward the right loudspeaker, with the sound source vector modification module 812 by moving that audio source to another sound source vector (Ss) that was identified as not containing an audio source. The vector processing module 824 operates to identify and/or isolate sound sources and spatial slices as best as possible, while the sound source vector modification module 812 serves to modify the identified and/or isolated sound sources and spatial slices. The spatial location may be changed between audio modes as described herein.

Creating the output channels may include combining together or dividing a number of the sound source vectors (Ss) with the assembly module 814 depending on the location in user perceived sound stage of the perceptual location or spatial slice from which the sound source vector (Ss) was derived. For example, in a system with five output channels, the sound source vectors (Ss) from a number of perceptual locations near the center of the listener perceived sound stage may be combined to form a center output channel to drive a center loudspeaker. In another example of a surround sound output system with five channels, where there are only four spatial slices, two of the spatial slices may be combined to form the side or rear output channels. In other examples, the number of perceptual locations or spatial slices may match the number of output channels. As previously discussed, this allows two channel stereo recordings to be converted to 5, 6, 7, or any number of output channels.

The sound source vector (Ss) may also be re-arranged or re-mapped by the assembly module 814 working in conjunction with the sound source vector modification module 812 to move the audio sources in the original audio input signal to different locations in the listener perceived sound stage. Since each of the audio sources in the listener perceived sound stage may be contained in a separate one of the sound source vectors (Ss), the sound sources may be moved or mapped into different locations in the listener perceived sound stage. In other words, since the location in the listener perceived sound stage of each audio source in the audio input signal is determined and captured, and since the audio sources may be separated into individual perceptual locations, or spatial slices, with the sound source vectors (Ss), it can be determined whether the sound sources should be placed in generally the same position in output audio channels, or moved to a new perceptual location in the output audio channels. The perceived location of the audio or audio components may change between the audio modes described herein.

For example, if a first perceptual location, or spatial slice, contains a singer's voice, and a second perceptual location located adjacent to the first perceptual location includes a guitar, the singers voice may be allocated or mapped to the center output, channel, and the guitar may be allocated or mapped to both the left and right sides of the listener perceived sound stage separated away from the singer's voice. The singer's voice and the guitar may be separated by appropriately mapping the sound source vector (Ss) containing the singers voice into the center output channel, and mapping the sound source vector (Ss) containing the guitar into the left and right front, side and/or rear output channels with the assembly module 814. Thus, the audio processing system 702 may not only convert a two channel audio input signal into any number of multi-channel output signals, such as a surround sound output signals, but also allow individual audio sources in the audio input signal to be allocated to any of one or more of the desired output channels.

In addition, a sound source vector (Ss) may be allocated to two different output channels so that when the output channels drive adjacently positioned loudspeakers, the audio source included in the sound source vector (Ss) is perceptually perceived as located between the two loudspeakers. Further, in particular applications, such as when loudspeakers are located in a vehicle at different heights and orientations, such as in door panels, a dashboard or a rear deck of the vehicle, the sound source vectors (Ss) may be selectively allocated proportionally in view of the loudspeaker locations to optimize the listening experience at the driver and passenger seats in the vehicle. Also, groups of sound source vectors (Ss) may be statically mapped to one or more output channels. Alternatively, sound source vectors (Ss) may be dynamically grouped by the assembly module 814 such that different sound source vectors (Ss) may appear in one or more output channels for a period of time and then move to one or more other output channels automatically based on external parameters from the parameter input controller 808, the content of the audio input signal, or any other criteria to useable to trigger a change in the mapping of the sound source vectors (Ss) to the output channels. Accordingly, mapping of the sound source vectors (Ss) to the output channels may be one-to-one mapping, or one-to-many mapping, or many-to-one mapping. The mappings of some or all of the sound source vectors (Ss) may be such that the Left input signal is mapped to output channels (and subsequently to speakers) on the left side of a playback speaker array, and the Right input signal is mapped to output channels (and subsequently to speakers) on the right side of the playback speaker array. Additionally, or alternatively, the mappings of some or all of the sound source vectors (Ss) may be such that the Left input signal is mapped to output channels on the Right side of the speaker array, and/or the Right input signal is mapped to output channels on the Left side of the speaker array. Additionally, or alternatively, the mappings of some or all of the sound source vectors (Ss) may be such that the Left input signal is mapped to output channels on both sides of the speaker array, and/or the Right input signal is mapped to output channels on both sides of the speaker array. The choice of mappings may be predetermined and set by a user as required to obtain a desired listener perceived soundstage for the output signals for a given audio mode. These may be different for different audio modes. The mapping of the sound source vectors (Ss) to the output channels may be frequency dependent such that the mapping may vary with frequency. In one example, frequency dependent mapping may be used to obtain better and more stable spatial images in the reproduced soundstage. These frequencies may be different for different audio modes. When the audio mode is changed, then the frequency response is smoothly changed from the current audio mode to the subsequent audio mode without an interruption of audio output.

The audio output channels on the output channel lines 810 may be received by the post-processing module 804. The post-processing module 804 may convert the frequency based audio output channels to a time-based audio output channels using any form of frequency domain to time domain conversion process. The post processing module 804 includes a converter 816 and a windowing module 818 for each of the audio output channels included in the audio output signal. The converter 816 and the windowing module 818 may use a Discrete Fourier Transform (DFT), or other transformation process to convert to blocks of time samples. In other examples, the audio output channels provided on the output channel lines may be in the time domain due to processing with the sound source vector processing module 806 being at least partially performed in the time domain, and the post processing module 804 may be omitted.

Figure 9:
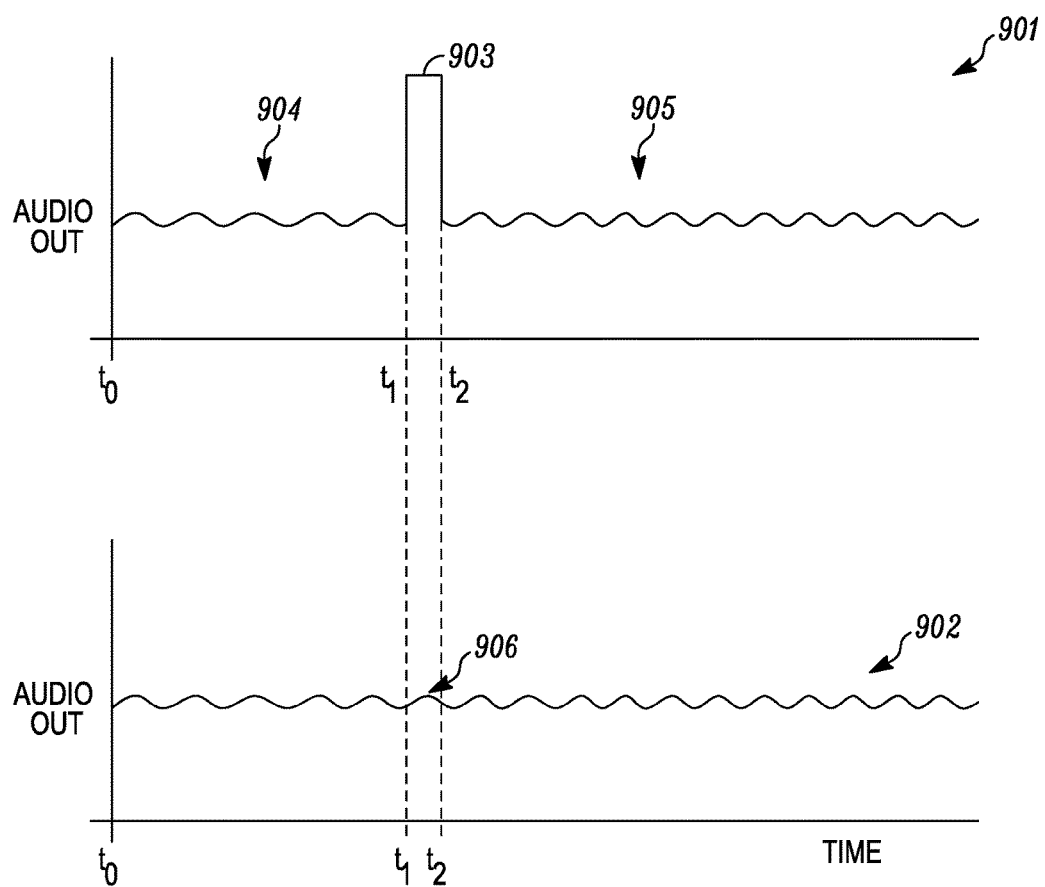
FIG. 9 shows a view of an audio signal generated by the methods and systems described herein.

FIG. 9 shows two graphs 901, 902 of audio output from the audio systems over time. From time $t_0$ to time $t_1$ the audio signal is processed according to a first audio processing scheme, 904. Between time $t_1$ and time $t_2$, the audio processing is in a transition state from the first audio processing scheme to a subsequent processing scheme. The transition state is intermediate the two audio processing schemes. After time $t_2$ the audio signal is being processed according to a second audio processing scheme. At time $t_1$, the audio system producing the audio output begins a change from a first audio mode to a second audio mode. Graph 901 shows an audio output signal when the audio system does not employ the audio smoothing techniques as described herein. During the time frame $t_1$-$t_2$, a significant change 903 in the audio output is present due to the change in audio processing schemes. The audio signal at 903 between the times $t_1$ and $t_2$ would produce an audio signal that a listener would hear as a discontinuity, which may be perceived as a pop or click. When the presently described audio-signal processing schemes are employed, the audio signal 906 during the time frame $t_1$-$t_2$ is continuous or smooth. The audio signal 906 does not significantly change from the audio signal during time frame $t_0$-$t_1$ from the first audio processing system/scheme to the audio signal during the time after $t_2$. The listener would not hear any significant change in the audio from the first processing scheme/system to the subsequent processing scheme/system.

Prior to the present disclosure, audio systems with multiple audio modes tune each of audio system's modes independently and thus cause interruptions in the audio when the audio mode is changed, particularly intermediate the current audio mode and the subsequent audio mode. The audio tuning tool would have a set of parameters that are independent to each mode and the tuning tool would not cross reference between the two modes. An example audio system is the QuantumLogic Surround (QLS) tuning tool from Harman International of Stamford, Conn. For example, an audio system may have an audience mode, an on-stage mode and a stereo/off mode. Other audio modes are within the scope of the present disclosure. Each mode would have a different spatial impression than the other modes. Examples of the QLS tuning tool are described in greater detail in U.S. Pat. No. 8,670,850 and published applications US2011081032 and US2011081024. U.S. Pat. No. 8,670,850, US2011081032, and US2011081024 are hereby incorporated by reference as are any documents identified herein. As the audio system would change over from one mode to another mode, the audio system would be muted to prevent undesirable sounds from being emitted as the system transitions from one mode to another mode. Accordingly, it was discovered by the present inventors that it is desired to achieve a smooth and seamless transition from one audio system mode to another audio system mode such that the user does not experience a muted period in the audio transition. That is the audio is continuously played without any discontinuity between the audio modes.

The present disclosure describes audio processing parameters changing between various modes. This can be done by determining the difference in values between the two modes. This difference can be spread out across the transition time intermediate the two modes. In an example, the change is divided into equal increments across the transition time. In some cases the difference is not large enough so that the change to the new operational parameter can be done more quickly than the transition time without producing a discontinuous audio component (e.g., an audio artifact) that will be heard by the listener. In this case, the change to the next operational parameter value can be done in less time than the transition time.

Some audio processing systems are capable of providing at least two separate sound zones in one coherent listening room. In each sound zone, resulting acoustic signals substantially corresponds to a respective audio source signal associated with the same sound zone, and the contribution of audio source signals associated with a different sound zone to the resulting sound signal is minimized. When the system changes sound zones or changes to anther audio signal processing scheme (e.g., stereo, audience, on-stage, etc.), the presently described methods and systems smooth the audio signal being produced between the sound zone processing and subsequent scheme. Examples of individual sound zone audio processing can be found in US Patent Publication Nos. 2014/0348354 and 2011/0286614, which are hereby incorporated by reference for any purpose.

As described herein, system(s) and method(s) for achieving a smooth and seamless transition from one audio mode to another audio mode are described. In an example of the present disclosure, there are multiple audio modes. There may be three or more audio modes in an audio system. For example, the audio modes can be the off/stereo mode, the on-stage mode, and the audience mode. As described herein, the system and method remove "muting" at the transition intermediate the audio modes. Accordingly, there can be a smooth crossfade when the audio system user is in a first mode (such as on-stage) and then the user changes over to a second mode (such as audience mode). With respect to time, the smooth crossfade between the modes could be linear or non-linear.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

We claim:

1. An audio processing method, comprising:
producing an audio signal in a first audio mode having a plurality of first parameters;
changing to a second audio mode having a plurality of second parameters;
continuously producing the audio signal while changing to the second audio mode using a plurality of stepped parameter changes intermediate the plurality of first parameters of the first audio mode and the plurality of second parameters of the second audio mode; and
producing the audio signal in the second audio mode,
wherein continuously producing includes outputting a first audio signal using the first audio mode, outputting a second audio signal using the second audio mode, and combining the first audio signal and second audio signal to produce an output signal that changes to only having the second audio signal over a time period with a reduced audio artifact in the time period.

2. The method of claim 1, wherein combining includes starting from the output signal being the first audio signal to being only the second audio signal over the time period.

3. The method of claim 2, wherein the time period is about 1.0 second.

4. The method of claim 2, wherein the plurality of second parameters of the second audio mode include a gain and an equalization parameter that are different from parameters of the first audio mode.

5. The method of claim 1, wherein continuously producing includes determining a difference from a first parameter of the plurality of first parameters of the first audio mode and a second parameter of the plurality of second parameters in the second audio mode and changing the first parameter, which has a difference from the second parameter, to the second parameter over a time period.

6. The method of claim 5, wherein changing the first parameter to the second parameter includes continuously changing the first parameter with the difference to the second parameter.

7. The method of claim 6, wherein the first parameter is a first gain value and the second parameter is a second gain value that is different than the first gain value.

8. The method of claim 6, wherein the first parameter is a first equalization value and the second parameter is a second equalization value different than the first equalization value.

9. The method of claim 6, wherein the first audio mode is one of a stereo/off mode, an on-stage mode and an audience mode and the second audio mode is another of the stereo/off mode, the on-stage mode and the audience mode.

10. An audio system comprising:
a first audio processor receiving an input audio signal, applying first processing parameters to the input audio signal, and producing a first output audio signal using the first processing parameters including gain and equalization parameters;
a second audio processor receiving the audio input signal, applying second processing parameters to the audio input signal, and producing a second output signal using the second processing parameters including gain and equalization parameters; and
a controller configured to switch between the first audio processor and the second audio processor by blending the second output signal with the first output signal to produce a continuous, aurally smooth audio output signal, wherein blending includes stepping both the gain and equalization parameters from the first processing parameters to the second processing.

11. The system of claim 10, wherein the controller is configured to determine differences between the first processing parameters and the second processing parameters and then stepping the processing parameters from the first processing parameters to the second processing parameters in increments.

12. The system of claim 10, wherein the controller is configured to blend the second output signal with the first output signal over a transition time period to produce the continuous, aurally smooth output signal.

13. The system of claim 12, wherein the controller is configured to control a global gain setting by reducing global gain during the transition time and to return the global gain after the transition time.

14. The system of claim 13, further comprising an amplifier receiving the output signal, amplifying the output signal by the global gain and outputting an amplified signal to a speaker system.

15. The system of claim 10, wherein at least one of the first audio processor and the second audio processor is configured to process the input signal using a plurality source vectors with different parameters being applied to each source vector to achieve a sound profile, wherein the different parameters for the plurality source vectors are uniformly stepped from first audio processor to the second audio processor.

16. The system of claim 15, wherein the sound profile is one of a stereo-off mode, an audience mode and an on-stage mode.

17. An audio system comprising:
an audio processor receiving an input audio signal and producing an output audio signal using processing parameters; and
a controller to switch between first processor parameters and second processing parameters by determining differences between the first processor parameters and the second processing parameters and instructing the audio processor to incrementally step the processing parameters with differences over a transition time period with the audio processor to produce a continuous, aurally smooth audio output signal during the transition time period;
the controller further configured to determine differences between the first processing parameters and the second processing parameters and then stepping the processing parameters from the first processing parameters to the second processing parameters in increments.

18. The audio system of claim 17, wherein the controller includes a memory to store the first processor parameters and the second processing parameters.

19. The audio system of claim 17, wherein the transition time period is about 1.0 second.

* * * * *